United States Patent
Gu et al.

(10) Patent No.: US 10,122,348 B2
(45) Date of Patent: Nov. 6, 2018

(54) INTERFERENCE-IMMUNIZED MULTIPLEXER

(71) Applicant: Futurewei Technologies, Inc., Plano, TX (US)

(72) Inventors: Liang Gu, San Jose, CA (US); Yuming Cao, Pleasanton, CA (US); Gong Lei, Sunnyvale, CA (US); Yen Dang, San Jose, CA (US); Yifan Gu, Santa Clara, CA (US); Hungyi Lee, Cupertino, CA (US); Mamatha Deshpande, San Jose, CA (US); Shou-Po Shih, Cupertino, CA (US); Yan Duan, Ames, IA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/084,918

(22) Filed: Mar. 30, 2016

(65) Prior Publication Data
US 2017/0288652 A1 Oct. 5, 2017

(51) Int. Cl.
*H04L 7/027* (2006.01)
*H03K 3/356* (2006.01)
*H03K 3/037* (2006.01)
*H04L 7/00* (2006.01)

(52) U.S. Cl.
CPC ....... *H03K 3/356104* (2013.01); *H03K 3/037* (2013.01); *H04L 7/0012* (2013.01); *H04L 7/0079* (2013.01); *H04L 7/027* (2013.01)

(58) Field of Classification Search
CPC .. H03K 3/356104; H03K 3/037; H04L 7/027; H04L 7/0079; H04L 7/0012
See application file for complete search history.

(56) References Cited

U.S. PATENT DOCUMENTS

| 6,340,899 B1 * | 1/2002 | Green | H03F 1/42 326/115 |
|---|---|---|---|
| 7,233,176 B2 | 6/2007 | Sharma et al. | |

(Continued)

FOREIGN PATENT DOCUMENTS

CN 102300120 A 12/2011

OTHER PUBLICATIONS

Machine Translation and Abstract of Chinese Publication No. CN102300120, Dec. 28, 20141, 13 pages.

(Continued)

*Primary Examiner* — Kenneth Lam
(74) *Attorney, Agent, or Firm* — Conley Rose, P.C.

(57) ABSTRACT

A multiplexer comprises: an output circuit comprising a multiplexer output; and a first buffer coupled to the output circuit and comprising: a first selection input configured to receive a first selection signal; a first logical input configured to receive a first logical input signal; and a first ground; wherein the multiplexer is configured to: couple the first logical input to the multiplexer output when the first selection signal is a first value; and couple the first logical input to the first ground when the first selection signal is a second value. A method comprises: receiving a selection signal and a first logical input signal; coupling a first logical input to a multiplexer output when the selection signal is a first value; and coupling the first logical input to a ground when the selection signal is a second value.

14 Claims, 5 Drawing Sheets

(56) References Cited

U.S. PATENT DOCUMENTS

2012/0057606 A1* 3/2012 Cui .................. H04J 3/047
370/516
2017/0063580 A1* 3/2017 Kireev .................. H04L 25/06

OTHER PUBLICATIONS

Foreign Communication From a Counterpart Application, PCT Application No. PCT/CN2017/078590, International Search Report dated Jun. 19, 2017, 4 pages.

* cited by examiner

INTERFERENCE-IMMUNIZED MULTIPLEXER

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

A multiplexer is a device that receives multiple input signals, selects one of the input signals, and provides that input signal as an output signal. The multiplexer selects the input signal based on a selection signal, which the multiplexer receives from a controller. For example, if the multiplexer receives a low voltage signal, or a logical 0, as a selection signal, then the multiplexer selects and provides a first input signal. If the multiplexer receives a high voltage signal, or a logical 1, as a selection signal, then the multiplexer selects and provides a second input signal.

SUMMARY

In one embodiment, the disclosure includes a multiplexer comprising: an output circuit comprising a multiplexer output; and a first buffer coupled to the output circuit and comprising: a first selection input configured to receive a first selection signal; a first logical input configured to receive a first logical input signal; and a first ground; wherein the multiplexer is configured to: couple the first logical input to the multiplexer output when the first selection signal is a first value; and couple the first logical input to the first ground when the first selection signal is a second value. In some embodiments, the first buffer further comprises a first logical output coupled to the output circuit; the first selection input comprises a second selection input and a third selection input, wherein the first logical input is a differential first logical input comprising a second logical input and a third logical input, and wherein the first logical output is a differential first logical output comprising a second logical output and a third logical output; the first buffer further comprises: a voltage source; a first transistor coupled to the voltage source and the second selection input; a second transistor coupled to the second selection input and the first ground; a third transistor coupled to the second selection input, the first ground, and the third logical output; and a fourth transistor coupled to the second selection input, the first ground, and the second logical output; the first transistor is a p-type metal-oxide-semiconductor (PMOS) transistor, and wherein the second transistor, the third transistor, and the fourth transistor are n-type metal-oxide-semiconductors (NMOSs); the multiplexer further comprises: a second buffer that is a mirror image of the first buffer and is coupled to the output circuit; the multiplexer further comprises: a second buffer coupled to the output circuit and comprising: a second selection input configured to receive a second selection signal; a second logical input configured to receive a second logical input signal; and a second ground; the multiplexer is further configured to: couple the second logical input to the multiplexer output when the second selection signal is the first value; couple the second logical input to the second ground when the second selection signal is the second value; the first ground and the second ground are the same; the multiplexer output is a differential multiplexer output comprising a first multiplexer output and a second multiplexer output; the output circuit further comprises: a first logical input coupled to the first buffer; a second logical input coupled to the first buffer; a third logical input; a fourth logical input; a current source; and a second ground coupled to the current source; the output circuit further comprises: a first transistor directly coupled to the first multiplexer output and the current source; a second transistor directly coupled to the second multiplexer output and the current source; a third transistor directly coupled to the first multiplexer output and the current source; and a fourth transistor directly coupled to the second multiplexer output and the current source; the first transistor, the second transistor, the third transistor, and the fourth transistor are n-type metal-oxide-semiconductor (NMOS) transistors.

In another embodiment, the disclosure includes an apparatus comprising: a bypass mode path configured to provide a first signal; a re-timer mode path comprising a clock and data recovery (CDR) component configured to provide a re-timed signal based on the first signal; and a multiplexer coupled to the bypass mode path and the re-timer mode path and configured to: receive a selection signal; select the first signal and couple the re-timed signal to a ground when the selection signal is a first value; and select the re-timed signal and couple the first signal to the ground when the selection signal is a second value. In some embodiments, the multiplexer comprises a first buffer configured to: pass the first signal when the selection signal is the first value; and couple the first signal to a ground when the selection signal is the second value; the multiplexer further comprises a second buffer configured to: couple the re-timed signal to the ground when selection signal is the first value; and pass the re-timed signal when the selection signal is the second value.

In yet another embodiment, the disclosure includes a method comprising: receiving a selection signal and a first logical input signal; coupling a first logical input to a multiplexer output when the selection signal is a first value; and coupling the first logical input to a ground when the selection signal is a second value. In some embodiments, the method further comprises: passing the first logical input signal through a first buffer and an output circuit when the selection signal is the first value; and coupling the first logical input signal to the ground through the first buffer when the selection signal is the second value; the method further comprises: receiving a second logical input signal; coupling a second logical input to the ground when the selection signal is the first value; and coupling the second logical input to the multiplexer output when the selection signal is the second value; the method further comprises: coupling the second logical input signal to the ground through a second buffer when the selection signal is the first value; and passing the second logical input signal through the second buffer and the output circuit when the selection signal is the second value.

BRIEF DESCRIPTION OF THE DRAWINGS

For a more complete understanding of this disclosure, reference is now made to the following brief description.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A multiplexer, for instance a multiplexer operating at a bit rate at or above 15 gigabits per second (Gb/s), may experience performance degradation. Specifically, even though the multiplexer has an unselected input signal and a selected input signal, the unselected input signal may interfere with the selected input signal and cause the multiplexer to experience jitter at its output. Jitter is defined as a deviation from periodicity, typically in relation to a reference clock. It is therefore desirable to reduce or eliminate, and therefore immunize multiplexers from, such interference.

Disclosed herein are embodiments for interference-immunized multiplexers. The disclosed multiplexers comprise a first buffer circuit, a second buffer circuit, and an output circuit coupled to the first buffer circuit and the second buffer circuit. The first buffer circuit and the second buffer circuit replace single transistors that exist in other multiplexers. Those single transistors receive selection signals and are coupled in series to corresponding differential inputs and a corresponding output. Instead, the first buffer circuit and the second buffer circuit either provide differential output signals when they are selected by a selection signal or do not provide the differential output signals when they are not selected by the selection signal. In the latter case, outputs of the first buffer circuit and the second buffer circuit are tied to ground. As a result, the disclosed multiplexers are substantially or completely immunized from unselected input signal interference. In addition, such immunization enables the disclosed multiplexers to operate at relatively lower supply voltages.

Figure 1:
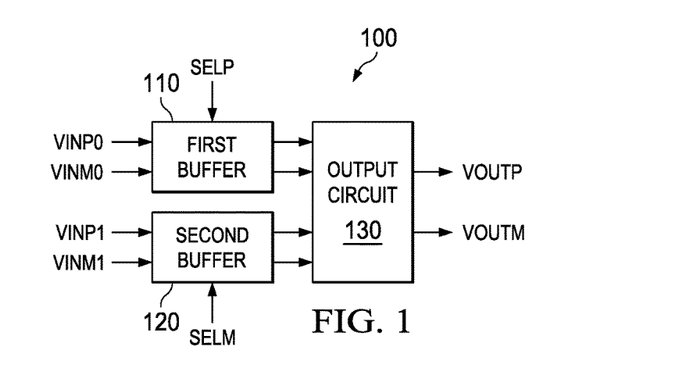
FIG. 1 is an abstracted schematic diagram of a multiplexer according to an embodiment of the disclosure.

FIG. 1 is an abstracted schematic diagram of a multiplexer 100 according to an embodiment of the disclosure. The multiplexer 100 comprises a first buffer 110, a second buffer 120, and an output circuit 130 coupled to the first buffer 110 and the second buffer 120. The first buffer 110 comprises logical inputs VINP0 and VINM0, and the second buffer 120 comprises logical inputs VINP1 and VINM1. The multiplexer 100 and its components are described more fully below.

Figure 2:
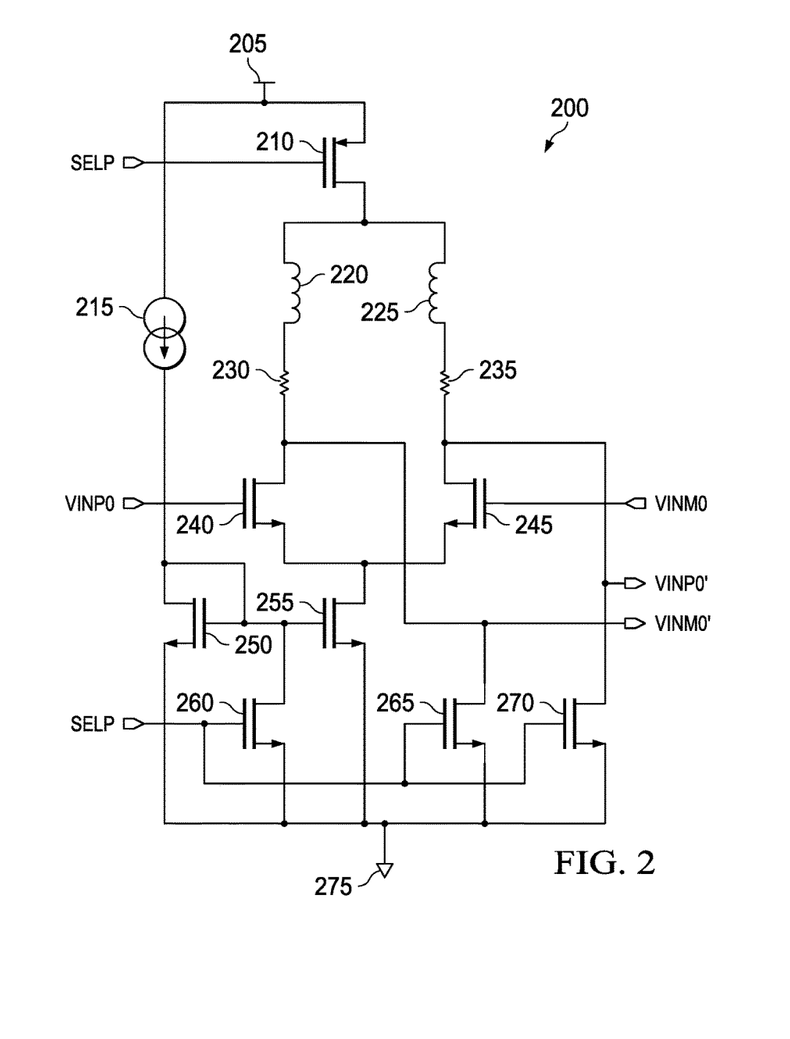
FIG. 2 is a schematic diagram of a buffer according to an embodiment of the disclosure.

FIG. 2 is a schematic diagram of a buffer 200 according to an embodiment of the disclosure. The buffer 200 may implement the first buffer 110. The buffer 200 comprises a source voltage 205; transistors 210, 240, 245, 250, 255, 260, 265, 270 (210-270); a current source 215; inductors 220, 225; resistors 230, 235; and a ground 275, all connected as shown in FIG. 2. In addition, the buffer 200 comprises two selection inputs SELP; logical inputs VINP0, VINM0; and logical outputs VINP0', VINM0'.

The source voltage 205 provides any suitable voltage. For instance, the source voltage 205 provides a voltage of about 5 volts (V) or less. The buffer 200 may not have its own power source on its chip. In that case, the source voltage 205 is a connection to an actual source voltage. The current source 215 provides any suitable constant current. For instance, the current source 215 provides a current of about 3 milliamps (mA) or less.

The inductors 220, 225 compensate for or reduce parasitic capacitance in the buffer 200, thereby extending an operational bandwidth of the buffer 200. The inductors 220, 225 provide any suitable inductance values. For instance, the inductors 220, 225 provide inductance values between about 400 picohenries (pH) and about 600 pH.

The resistors 230, 235 provide a load for the buffer 200. The resistors 230, 235 provide any suitable resistance values. For instance, the resistors 230, 235 provide resistive values between about 100 ohms (Ω) and about 200Ω. The transistors 210, 240, 245, 250, 255, 260, 265, 270 comprise both a p-type enhancement mode transistor 210 and n-type enhancement mode transistors 240, 245, 250, 255, 260, 265, 270 (240-270).

Figure 3:
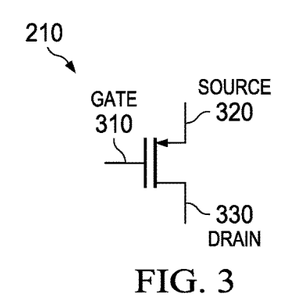
FIG. 3 is a schematic diagram of the p-type enhancement mode transistor in FIG. 2.

FIG. 3 is a schematic diagram of the p-type enhancement mode transistor 210 in FIG. 2. The transistor 210 is a p-type metal-oxide-semiconductor field-effect transistor (MOSFET), or PMOS. The transistor 210 comprises a gate 310, a source 320, and a drain 330. When the gate 310 receives a logical 0, the transistor 210 is "turned on," meaning that the source 320 and the drain 330 electrically couple to each other to allow a current to flow between them. When the gate 310 receives a logical 1, the transistor 210 is "turned off," meaning that the source 320 and the drain 330 do not electrically couple to each other to allow a current to flow between them. Thus, the transistor 210 acts as an open circuit between the source 320 and the drain 330.

Figure 4:
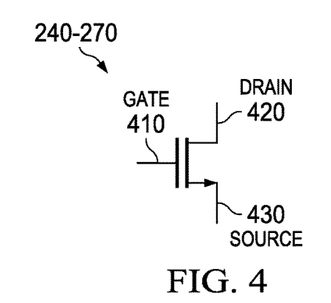
FIG. 4 is a schematic diagram of the n-type enhancement mode transistors in FIG. 2.

FIG. 4 is a schematic diagram of the n-type enhancement mode transistors 240-270 in FIG. 2. The transistors 240-270 are n-type MOSFETs, or NMOSs. The transistors 240-270 comprise a gate 410, a drain 420, and a source 430. When the gate 410 receives a logical 0, the transistors 240-270 are turned off, meaning that the drain 420 and the source 430 do not electrically couple to each other to allow a current to flow between them. Thus, the transistors 240-270 act as an open circuit between the drain 420 and the source 430. When the gate 410 receives a logical 1, the transistors 240-270 are turned on, meaning that the drain 420 and the source 430 electrically couple to each other to allow a current to flow between them.

Returning to FIG. 2, in operation when the selection inputs SELP receive a selection signal that is a logical 0, the transistor 210 is turned on and couples the source voltage 205 to the transistors 240, 245. In addition, the transistors 260, 265, 270 (260-270) are turned off and uncouple from the ground 275. As an example, the buffer 200 receives a differential logical input signal, specifically a logical high input signal at the logical input VINP0 and a logical low input signal at the logical input VINM0. In that case, the transistor 240 is turned on, so the logical output VINM0', which is connected to the drain of the transistor 240, receives a voltage that is about equivalent to the voltage from the source voltage 205 minus a voltage drop across the resistor 230. The total voltage approximates a logical low signal. Thus, the logical output VINM0' provides a logical low output signal. At the same time, the transistor 245 is turned off, so the logical output VINP0', which is connected to the drain of the transistor 245, receives a voltage of about the source voltage 205. That voltage approximates a logical high signal. Thus, the logical output VINP0' provides a logical high output signal. Together, the logical low output signal at VINM0' and the logical high output signal at VINP0' form a differential logical output signal.

When the selection inputs SELP receive a selection signal that is a logical 1, the transistor 210 is turned off and uncouples the source voltage 205 from the transistors 240, 245, the drains of which are connected to the logical outputs VINM0', VINP0', respectively. At the same time, the transistors 260-270 are turned on and couple the logical outputs VINP0', VINM0' to the ground 275. Thus, the logical outputs VINP0', VINM0' provide logical low output signals. As can be seen, based on the selection inputs SELP, the buffer 200 either provides a differential logical output signal or provides no signal at all.

Table 1 is a simplified logic table for the buffer 200.

TABLE 1

Simplified logic table for the buffer 200

| SELP | VINP0' | VINM0' |
|---|---|---|
| 0 | VINM0 | VINP0 |
| 1 | 0 | 0 |

Table 1 is simplified in that logical values are not listed in every cell. For instance, when the selection signal at the selection inputs SELP is 0, the logical output VINP0' provides whatever logical input signal the logical input VINM0 receives, and the logical output VINM0' provides whatever logical input signal the logical input VINP0 receives. When the selection signal at the selection inputs SELP is 1, the logical outputs VINP0', VINM0' provide logical low output signals.

As mentioned above, the buffer 200 may implement the first buffer 110. In addition, a mirror image of the buffer 200 may implement the second buffer 120. However, the mirror image comprises two selection inputs SELM; logical inputs VINP1, VINM1; and logical outputs VINP1', VINM1'. Thus, if the selection inputs SELP drive the first buffer 110, then the selection inputs SELM drive the second buffer 120. Likewise, if the selection inputs SELM drive the first buffer 110, then the selection inputs SELP drive the second buffer 120.

Figure 5:
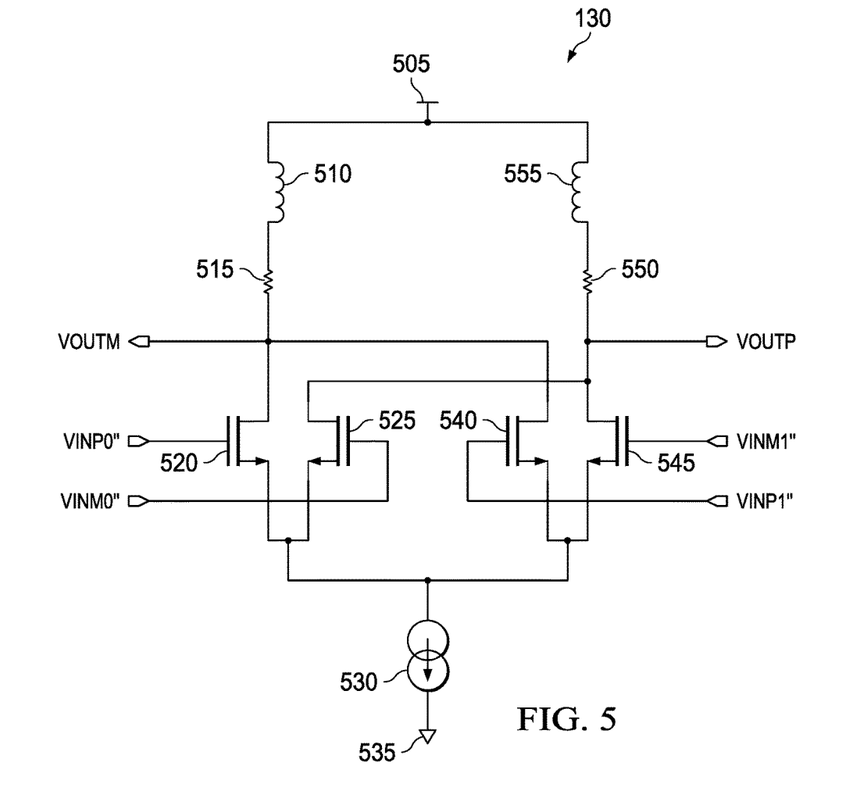
FIG. 5 is a detailed schematic diagram of the output circuit in FIG. 1.

FIG. 5 is a detailed schematic diagram of the output circuit 130 in FIG. 1. The output circuit 130 comprises a source voltage 505 similar to the source voltage 205; inductors 510, 555 similar to the inductors 220, 225; resistors 515, 550 similar to the resistors 230, 235; transistors 520, 525, 540, 545 (520-545) similar to the transistors 210-270; a current source 530 similar to the current source 215; and a ground 535 similar to the ground 275. In addition, the output circuit 130 comprises logical inputs VINP0", VINM0", VINP1", VINM1" and multiplexer outputs VOUTP, VOUTM. The logical inputs VINP0", VINM0", VINP1", VINM1" correspond to the logical outputs VINP0', VINM0', VINP1', VINM1', respectively, from the first buffer 110 and the second buffer 120.

The transistors 520-545 are directly coupled to the current source. The transistors 520, 525 are directly coupled to each other; the logical inputs VINP0", VINM0", respectively; and the multiplexer outputs VOUTM, VOUTP, respectively. The transistors 540, 545 are directly coupled to each other; the logical inputs VINP1", VINM1", respectively; and the multiplexer outputs VOUTM, VOUTP, respectively.

In operation, in a first example, the output circuit 130 receives no differential logical output signal from the second buffer 120, but does receive a differential logical output signal from the first buffer 110. Specifically, the output circuit 130 receives a logical low input signal at the logical input VINP0" and a logical high input signal at the logical input VINM0". In that case, the transistor 520 is turned off, so the multiplexer output VOUTM, which is connected to the drain of the transistor 520, receives a voltage of about the source voltage 505. That voltage approximates a logical high signal. Thus, the multiplexer output VOUTM provides a logical high output signal. At the same time, the transistor 525 is turned on, so the multiplexer output VOUTP, which is connected to the drain of the transistor 525, receives a voltage that is equivalent to the voltage from the source voltage 505 minus a voltage drop across the resistor 550. The total voltage approximates a logical low signal. Thus, the multiplexer output VOUTP provides a logical low output signal.

In a second example, the output circuit 130 receives no differential logical output signal from the first buffer 110, but does receive a differential logical output signal from the second buffer 120. Specifically, the output circuit 130 receives a logical low input signal at the logical input VINM1" and a logical high input signal at the logical input VINP1". In that case, the transistor 545 is turned off, so the multiplexer output VOUTP, which is connected to the drain of the transistor 545, receives a voltage of about the source voltage 505. That voltage approximates a logical high signal. Thus, the multiplexer output VOUTP provides a logical high output signal. At the same time, the transistor 540 is turned on, so the multiplexer output VOUTM, which is connected to the drain of the transistor 540, receives a voltage that is equivalent to the voltage from the source voltage 505 minus a voltage drop across the resistor 515. The total voltage approximates a logical low signal. Thus, the multiplexer output VOUTM provides a logical low output signal.

Table 2 is a simplified logic table for the output circuit 130.

TABLE 2

Simplified logic table for the output circuit 130

| VINP0" | VINM0" | VINP1" | VINM1" | VOUTP | VOUTM |
|---|---|---|---|---|---|
| VINM0 | VINP0 | 0 | 0 | VINP0 | VINM0 |
| 0 | 0 | VINM1 | VINP1 | VINP1 | VINM1 |

Table 2 is simplified in that logical values are not listed in every cell. For instance, when the logical inputs VINP0", VINM0" receive a differential logical output signal from the first buffer 110 and the logical inputs VINP1", VINM1" do not receive a differential logical output signal from the second buffer 120, the multiplexer output VOUTP provides whatever logical input signal the logical input VINP0 receives and the multiplexer output VOUTM provides whatever logical input signal the logical input VINM0 receives. When the logical inputs VINP1", VINM1" receive a differential logical output signal from the second buffer 120 and the logical inputs VINP0", VINM0" do not receive a differential logical output signal from the first buffer 110, the multiplexer output VOUTP provides whatever logical input signal the logical input VINP1 receives and the multiplexer output VOUTM provides whatever logical input signal the logical input VINM1 receives.

As can be seen, at any given time, the output circuit 130 receives a differential logical output signal either from the first buffer 110 or the second buffer 120. However, the output circuit 130 does not receive a first differential logical output signal from the first buffer 110 and a second differential logical output signal from the second buffer 120 at the same time. As a result, the output circuit 130 is immunized from the first differential logical output signal interfering with the second differential logical output signal. In addition, such immunization enables the source voltages 205, 505 in the multiplexer 100 to operate at relatively lower voltages.

Figure 6:
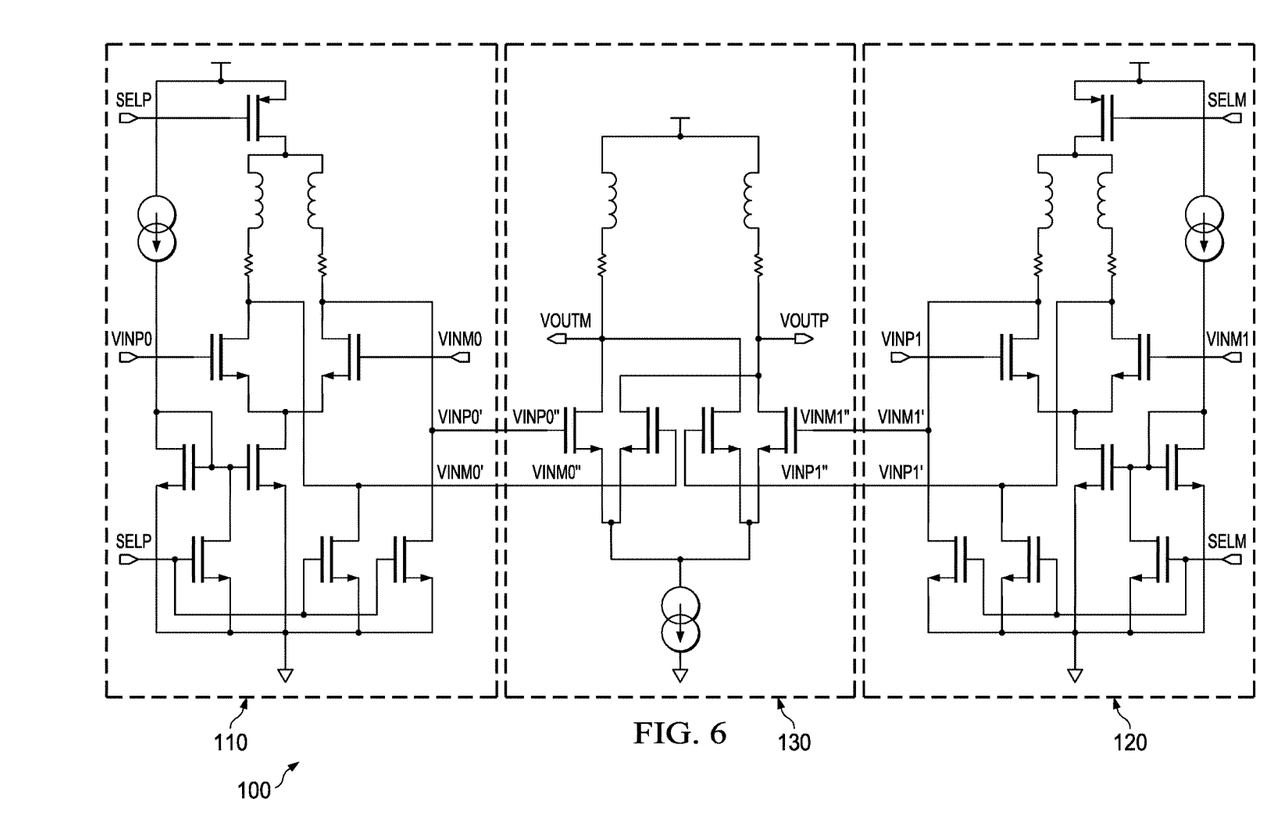
FIG. 6 is a detailed schematic diagram of the multiplexer in FIG. 1.

FIG. 6 is a detailed schematic diagram of the multiplexer 100 in FIG. 1. Like FIG. 1, FIG. 6 shows the first buffer 110, the second buffer 120, and the output circuit 130. The buffers 110 and 120 are similar to or the same as the buffer 200 of FIG. 2, and the circuit 130 is the same as the output circuit 130 of FIG. 5. Accordingly, the operation described therefore applies here in FIG. 6. In addition, unlike FIG. 1, FIG. 6 also shows each component of the first buffer 110, the second buffer 120, and the output circuit 130. For instance, FIG. 6 shows that the logical output VINP0' of the first buffer 110 couples to the logical input VINP0" of the output circuit 130, the logical output VINM0' of the first buffer 110 couples to the logical input VINM0" of the output circuit 130, the logical output VINP1' of the second buffer 120 couples to the logical input VINP1" of the output circuit 130, and the logical output VINM1' of the second buffer 120 couples to the logical input VINM1" of the output circuit 130.

Table 3 is a simplified logic table for the multiplexer 100. Table 3 combines the logic of both Table 1 and Table 2.

TABLE 3

Simplified logic table for the output multiplexer 100

| SELP | SELM | VOUTP | VOUTM |
|------|------|-------|-------|
| 0    | 1    | VINP0 | VINM0 |
| 1    | 0    | VINP1 | VINM1 |

Table 3 is simplified in that logical values are not listed in every cell. For instance, when the selection signal at the selection inputs SELP is 0 and the selection signal at the selection inputs SELM is 1, the multiplexer output VOUTP provides whatever logical input signal the logical input VINP0 receives and the multiplexer output VOUTM provides whatever logical input signal the logical input VINM0 receives. When the selection signal at the selection inputs SELP is 1 and the selection signal at the selection inputs SELM is 0, the multiplexer output VOUTP provides whatever logical input signal the logical input VINP1 receives and the multiplexer output VOUTM provides whatever logical input signal the logical input VINM1 receives.

In a first embodiment, the multiplexer 100 receives a logical high input signal from another component, then the multiplexer 100 uses inverter logic to provide a logical low input signal in order to form a differential input signal, meaning a signal having two voltage levels with respect to ground. The multiplexer 100 may do so for both logical input signals and selection signals. In a second embodiment, the multiplexer 100 receives differential logical input signals and differential selection signals form another component. In a third embodiment, the multiplexer 100 receives and provides single-ended signals, meaning signals having one voltage level with respect to ground.

Figure 7:
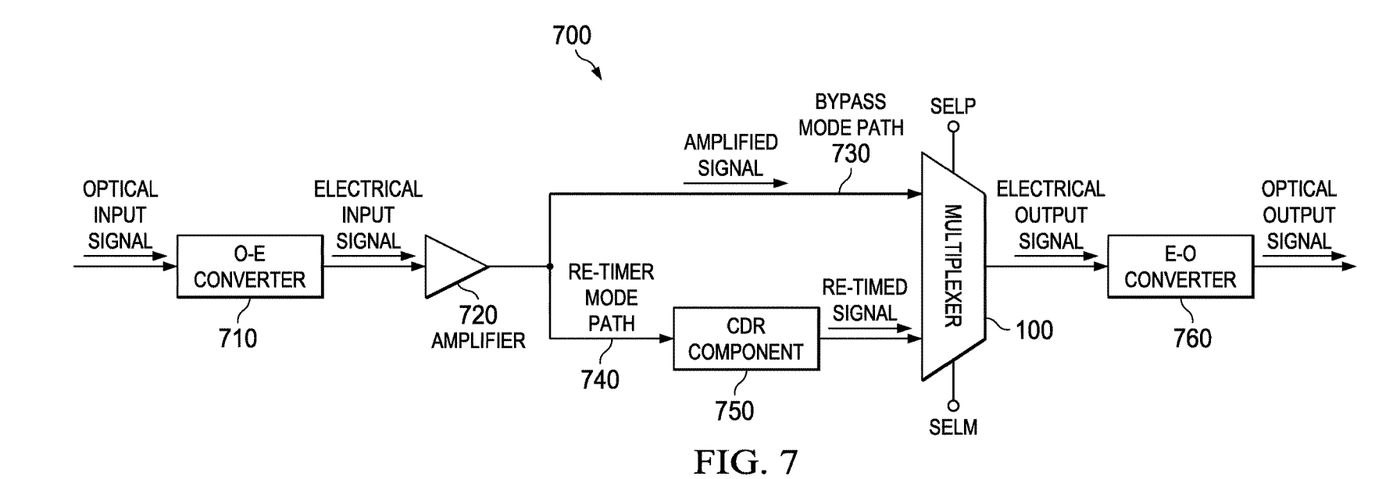
FIG. 7 is a schematic diagram of an optical transceiver according to an embodiment of the disclosure.

FIG. 7 is a schematic diagram of an optical transceiver 700 according to an embodiment of the disclosure. The transceiver 700 comprises an optical-to-electrical (O-E) converter 710, an amplifier 720, a bypass mode path 730, a re-timer mode path 740, a clock and data recovery (CDR) component 750, the multiplexer 100, and an electrical-to-optical (E-O) converter 760. The components of the transceiver 700 may be arranged as shown or in any other suitable manner.

The O-E converter 710 receives an optical input signal and converts the optical input signal to an electrical input signal. The amplifier 720 receives and amplifies the electrical input signal to produce an amplified signal. The amplified signal then follows both the bypass mode path 730 to the multiplexer 100 and the re-timer mode path 740 to the CDR component 750.

The CDR component 750 receives the amplified signal and recovers data from the amplified signal. For instance, if the amplified signal comprises clock data, then the CDR component 750 recovers the clock data from the amplified signal with or without a local clock signal. The CDR component 750 then re-times the amplified signal with the recovered clock data to produce and re-timed signal to the multiplexer 100.

The multiplexer 100 is referred to as a two-to-one (2:1) multiplexer because it receives two input signals, namely the amplified signal and the re-timed signal, and it provides one output signal, namely the electrical output signal. The multiplexer 100 functions as described above. Specifically, when the selection input SELP receives a selection signal that is a 0 and the selection input SELM receives a selection signal that is a 1, the multiplexer 100 provides the amplified signal to the E-O converter 760 and couples the re-timed signal to ground. In other words, only the bypass mode path 730 provides a signal to the E-O converter 760 through the multiplexer 100. When the selection input SELP receives a selection signal that is a 1 and the selection input SELM receives a selection signal that is a 0, the multiplexer 100 provides the re-timed signal and couples the amplified signal to ground. In other words, only the re-timer mode path 740 provides a signal to the E-O converter 760 through the multiplexer 100. Finally, the E-O converter 760 converts, depending on what the multiplexer 100 provides, either the amplified signal or the re-timed signal to an optical output signal.

The multiplexer 100 may switch back and forth between the bypass mode path 730 and the re-timer mode path 740 at a high data rate. Typically, this would introduce jitter. However, the multiplexer 100 either provides a signal from the bypass mode path 730 while coupling the re-timer mode path 740 to ground or provides a signal from the re-timer mode path 740 while coupling the bypass mode path 730 to ground. Thus, the multiplexer 100 eliminates or substantially eliminates such jitter.

FIG. 7 shows the multiplexer 100 in the context of a function that selects either an amplified signal or a re-timed signal. However, the multiplexer 100 may perform a function that selects between more than two input signals. If there are more than two input signals, then the multiplexer may provide a corresponding number of buffers 200. For instance, to implement a 4:1 multiplexer, the multiplexer 100 may provide four of the buffers 200. In addition, FIG. 7 shows the multiplexer 100 in the context of optical signals. However, the multiplexer 100 may be a part of purely electrical components or systems.

Figure 8:
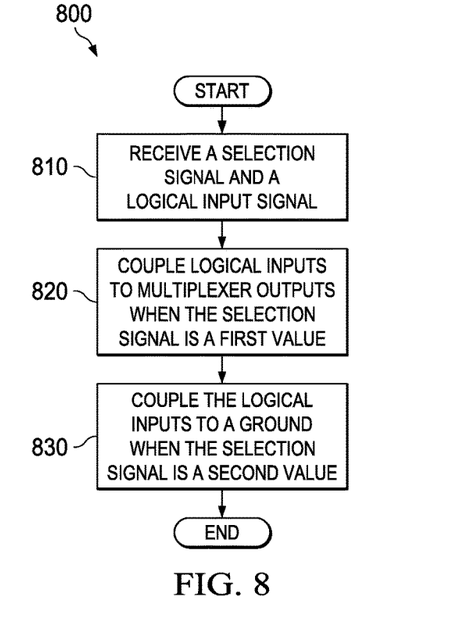
FIG. 8 is a flowchart illustrating a method of signal selection according to an embodiment of the disclosure.

FIG. 8 is a flowchart illustrating a method 800 of signal selection according to an embodiment of the disclosure. The multiplexer 100 may implement the method 800. At step 810, a selection signal and a logical input signal are received. For instance, the selection inputs SELP receive a selection signal and the logical inputs VINP0, VINM0 receive a logical input signal. At step 820, the logical inputs are coupled to multiplexer outputs when the selection signal is a first value. For instance, the logical inputs VINP0, VINM0 are coupled to the multiplexer outputs VOUTP, VOUTM when the selection signal is 0. At step 830, the logical inputs are coupled to a ground when the selection signal is a second value. For instance, the logical inputs VINP0, VINM0 are coupled to the ground 275 when the selection signal is 1.

The multiplexer 100 may implement the method 800 in the transceiver 700 as described above. In that case, the multiplexer 100 may switch back and forth between the bypass mode path 730 and the re-timer mode path 740 at a high data rate. Furthermore, the multiplexer 100 may eliminate or substantially eliminate jitter while doing so as also described above.

Figure 9:
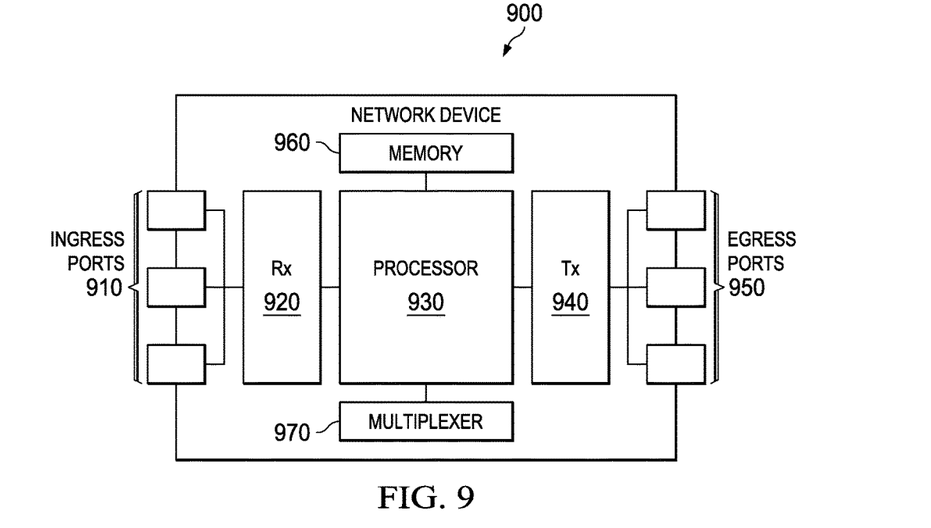
FIG. 9 is a schematic diagram of a device according to an embodiment of the disclosure.

FIG. 9 is a schematic diagram of a device 900 according to an embodiment of the disclosure. The device 900 is suitable for implementing the disclosed embodiments as described below. The device 900 comprises ingress ports 910 and receiver units (Rx) 920 for receiving data; a processor, logic unit, or central processing unit (CPU) 930 to process the data; transmitter units (Tx) 940 and egress ports 950 for transmitting the data; and a memory 960 for storing the data. The device 900 may also comprise O-E components and E-O components coupled to the ingress ports 910, the receiver units 920, the transmitter units 940, and the egress ports 950 for egress or ingress of optical or electrical signals.

The processor 930 is implemented by hardware and software. The processor 930 may be implemented as one or more CPU chips, cores (e.g., as a multi-core processor), field-programmable gate arrays (FPGAs), application specific integrated circuits (ASICs), and digital signal processors (DSPs). The processor 930 is in communication with the ingress ports 910, receiver units 920, transmitter units 940, egress ports 950, and memory 960. The processor 930 is coupled to a multiplexer 970. The multiplexer 970 implements the disclosed embodiments described above. For instance, the multiplexer 970 implements the multiplexer 100 and receiving selection signals from the processor 930. The inclusion of the multiplexer 970 therefore provides a substantial improvement to the functionality of the device 900 and effects a transformation of the device 900 to a different state.

The memory 960 comprises one or more disks, tape drives, and solid-state drives and may be used as an overflow data storage device, to store programs when such programs are selected for execution, and to store instructions and data that are read during program execution. The memory 960 may be volatile and non-volatile and may be read-only memory (ROM), random-access memory (RAM), ternary content-addressable memory (TCAM), and static random-access memory (SRAM).

A first component is directly coupled to a second component when there are no intervening components, except for a line, a trace, or other media, between the first component and the second component. The first component is indirectly coupled to the second component when there are intervening components between the first component and the second component. The termed "coupled" and its derivatives includes both directly coupled and indirectly coupled. The use of the term "about" means a range including ±10% of the subsequent number, unless otherwise stated. While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, components, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:
1. A multiplexer comprising:
  a first buffer comprising:
    a first selection input configured to receive a first selection signal;
    a first logical input configured to receive a first logical input signal;
    a first logical output; and
    a first ground;
  a second buffer comprising:
    a second selection input configured to receive a second selection signal;
    a second logical input configured to receive a second logical input signal;
    a second logical output; and
    a second ground; and
  an output circuit comprising:
    a third logical input coupled to the first logical output; and
    a fourth logical input coupled to the second logical output independently of the first logical output,
  wherein the multiplexer is configured to:
    couple, when the first selection signal has a first value, the first logical input to the third logical input to produce the first logical input signal to the third logical input; and
    couple, when the first selection signal has a second value, the first logical input to the first ground.

2. The multiplexer of claim 1, wherein the first selection input comprises a third selection input and a fourth selection input, wherein the first logical input is a differential first logical input comprising a fifth logical input and a sixth logical input, and wherein the first logical output is a differential first logical output comprising a third logical output and a fourth logical output.

3. The multiplexer of claim 2, wherein the first buffer further comprises:
a voltage source;
a first transistor coupled to the voltage source and the third selection input;
a second transistor coupled to the fourth selection input and the first ground;
a third transistor coupled to the fourth selection input, the first ground, and the fourth logical output; and
a fourth transistor coupled to the fourth selection input, the first ground, and the third logical output.

4. The multiplexer of claim 3, wherein the first transistor is a p-type metal-oxide-semiconductor (PMOS) transistor, and wherein the second transistor, the third transistor, and the fourth transistor are n-type metal-oxide-semiconductors (NMOSs).

5. The multiplexer of claim 1, wherein the multiplexer is further configured to:
couple, when the second selection signal has the first value, the second logical input to the fourth logical input to produce the second logical input signal to the fourth logical input; and
couple, when the second selection signal has the second value, the second logical input to the second ground.

6. The multiplexer of claim 1, wherein the first ground and the second ground are the same.

7. The multiplexer of claim 1, wherein the output circuit comprises a multiplexer output, and wherein the multiplexer output is a differential multiplexer output comprising a first multiplexer output and a second multiplexer output.

8. The multiplexer of claim 7, wherein the output circuit further comprises:
a fifth logical input;
a sixth logical input;
a current source; and
a third ground coupled to the current source.

9. The multiplexer of claim 8, wherein the output circuit further comprises:
a first transistor directly coupled to the first multiplexer output and the current source;
a second transistor directly coupled to the second multiplexer output and the current source;
a third transistor directly coupled to the first multiplexer output and the current source; and
a fourth transistor directly coupled to the second multiplexer output and the current source.

10. The multiplexer of claim 9, wherein the first transistor, the second transistor, the third transistor, and the fourth transistor are n-type metal-oxide-semiconductor (NMOS) transistors.

11. A method implemented in a multiplexer, the method comprising:
receiving, by a first selection input of a first buffer, a first selection signal;
receiving, by a second selection input of a second buffer, a second selection signal;
receiving, by a first logical input of the first buffer, a first logical input signal;
receiving, by a second logical input of the second buffer, a second logical input signal;
coupling, by the multiplexer and when the first selection signal has a first value, the first logical input to a third logical input of an output circuit to produce the first logical input signal to the third logical input;
coupling, by the multiplexer and when the first selection signal has a second value, the first logical input to a first ground of the first buffer;
coupling, by the multiplexer and when the second selection signal has the first value, the second logical input to a fourth logical input of the output circuit to produce the second logical input signal to the fourth logical input; and
coupling, by the multiplexer and when the second selection signal has the second value, the second logical input to a second ground of the second buffer.

12. The method of claim 11, wherein the first ground and the second ground are the same.

13. The method of claim 11, wherein the first selection input comprises a third selection input and a fourth selection input, and wherein the first logical input is a differential first logical input comprising a fifth logical input and a sixth logical input.

14. The method of claim 11, wherein the output circuit comprises a multiplexer output, and wherein the multiplexer output is a differential multiplexer output comprising a first multiplexer output and a second multiplexer output.

* * * * *

UNITED STATES PATENT AND TRADEMARK OFFICE
CERTIFICATE OF CORRECTION

PATENT NO. : 10,122,348 B2
APPLICATION NO. : 15/084918
DATED : November 6, 2018
INVENTOR(S) : Liang Gu et al.

Page 1 of 1

It is certified that error appears in the above-identified patent and that said Letters Patent is hereby corrected as shown below:

On the Title Page

Item (56) Column 2, should read:
Machine Translation and Abstract of Chinese Publication No. CN102300120, Dec. 28, 2011, 13 pages.

Signed and Sealed this
Eleventh Day of December, 2018

Andrei Iancu
*Director of the United States Patent and Trademark Office*